United States Patent [19]

Kamata et al.

[11] Patent Number: 4,646,029

[45] Date of Patent: Feb. 24, 1987

[54] VARIABLE-GAIN AMPLIFYING CIRCUIT

[75] Inventors: Yasuji Kamata, Hitachi; Kazuo Kato, Toukai, both of Japan

[73] Assignee: Hitachi, Ltd., Tokyo, Japan

[21] Appl. No.: 751,136

[22] Filed: Jul. 2, 1985

[30] Foreign Application Priority Data

Jul. 2, 1984 [JP] Japan .................................. 59-136683

[51] Int. Cl.[4] .............................................. H03G 3/30
[52] U.S. Cl. ...................................... 330/283; 330/86; 330/143; 330/254
[58] Field of Search ................... 330/86, 95, 110, 143, 330/144, 254, 283, 284; 357/28; 338/225 D, 23

[56] References Cited

U.S. PATENT DOCUMENTS

| | | | |
|---|---|---|---|
| 3,828,292 | 8/1974 | Grossman et al. | 338/23 X |
| 4,013,971 | 3/1977 | Sternbeck | 357/28 X |
| 4,166,981 | 9/1979 | Marchasson et al. | 330/143 X |
| 4,468,631 | 8/1984 | Goldberg | 330/284 |
| 4,547,743 | 10/1985 | Goto | 330/283 X |

Primary Examiner—James B. Mullins
Attorney, Agent, or Firm—Antonelli, Terry & Wands

[57] ABSTRACT

Herein disclosed is a variable gain amplifying circuit which comprises a heating element, a heat-sensitive resistance coupled thermally to the heating element, an amplifier including the heat-sensitive resistance, and means for controlling the heat of the heat element. This heat of the heating element is controlled so as to control the value of the heat-sensitive resistance. As a result that the value of the heat-sensitive resistance is controlled, the gain of that amplifier is controlled.

4 Claims, 9 Drawing Figures

4,646,029

VARIABLE-GAIN AMPLIFYING CIRCUIT

BACKGROUND OF THE INVENTION

The present invention relates to a variable-gain amplifying circuit and, more particularly, to a variable-gain amplifying circuit which is suitable for variably amplifying a high-frequency signal such as a video signal over a wide band range and with high accuracy.

Previous variable-gain amplifying circuits of this kind, have been disclosed in detail with regard to a multiplier in "Analog Integrated Circuit", pp. 231 to 252, written by Alan B. Grebene, translated by Shuji Nakazawa et al., and published by Kindai Kagaku Sha. In short, this multiplier has a function to output the product of two input signals. In other words, the multiplier is a circuit, in which the following equation holds if its output is designated at Z and if its two inputs are designated at X and Y:

$$Z = KXY \quad (1)$$

Here, letter K designates a constant. When the multiplier satisfying the equation (1) is used as the variable-gain amplifying circuit, however, the gain is varied by the signal Y if the input X, for example, is a video input signal.

FIG. 8 is a circuit diagram showing one specific example of the aforementioned multiplier. The multiplier shown in FIG. 8 uses transistors $Q_1$ to $Q_3$, of which: the transistors $Q_1$ and $Q_2$ have both their emitters connected with the collector of the transistor $Q_3$; the transistor $Q_3$ has its emitter earthed to the ground through a resistor $R_E$; the transistors $Q_1$ and $Q_2$ have their respective collectors connected with a power supply $V_{cc}$ through resistors $R_{L1}$ and $R_{L2}$ ($R_{L1} = R_{L2} = R_L$), respectively; an input signal $V_i$ is applied to the respective bases of the transistors $Q_1$ and $Q_2$; and an input signal $V_2$ is applied between the base of the transistor $Q_3$ and the ground, whereby an output signal $V_o$ is extracted from both the collectors of the transistors $Q_1$ and $Q_2$.

The multiplier thus constructed is frequently used because it is suitable for integration. Hence, the multiplier satisfies the following equation, provided that a relation of $V_T \gg V_i$ holds for a thermal voltage $V_T$ and that a relation of $V_2 \approx I_E R_E$ holds for the input voltage $V_2$ if the current to flow through the emitter of the transistor $Q_3$ is designated at $I_E$:

$$V_o = (R_L / V_T R_E) V_i V_2 \quad (2)$$

It can be understood that the equation (2) becomes similar to the equation (1) because the value $(R_L/V_T R_E)$ becomes constant. Here, a variable-gain amplifying circuit is attained if a video signal is inputted as the input signal $V_i$ to the multiplier shown in FIG. 8 and if the input signal $V_2$ is inputted as a control signal for gain variation.

However, the variable-gain amplifying circuit described above has problems that it is very highly influenced by temperatures and that its variation change is highly limited, because it makes use of the base-emitter exponential characteristics of the transistors $Q_1$ and $Q_2$.

FIG. 9 is a circuit diagram showing a specific example of the variable-gain amplifying circuit which has been proposed so as to solve the above-specified problems.

The variable-gain amplifying circuit shown in FIG. 9 is constructed, as follows. In FIG. 9, reference characters $Q_{11}$ to $Q_{18}$ indicate transistors, and characters $I_1$ and $I_2$ indicate current sources which are connected between the emitters of the transistors $Q_{11}$ and $Q_{12}$, and $Q_{13}$ and $Q_{14}$ and a power supply $V_{EE}$. The transistors $Q_{11}$ and $Q_{12}$ have both their emitters connected through a resistor $R_x$, both their bases fed with an input signal $V_x$ and both their collectors connected through diodes $D_1$ and $D_2$ with a resistor $R_M$ connected in series with a power supply $V_{cc}$ so that an output is extracted from both their collectors. The transistors $Q_{13}$ and $Q_{14}$ have both their emitters connected through a resistor $R_y$ and both their bases fed with an input signal $V_y$. The transistor $Q_{13}$ has its collector connected with the emitters of the transistors $Q_{16}$ and $Q_{18}$, whereas the transistor $Q_{14}$ has its collector connected with the emitters of the transistors $Q_{15}$ and $Q_{17}$. The transistors $Q_{15}$ and $Q_{16}$ have their bases connected with the collector of the transistor $Q_{11}$, whereas the transistors $Q_{17}$ and $Q_{18}$ have their bases connected with the collector of the transistor $Q_{12}$. The transistors $Q_{16}$ and $Q_{17}$ have their collectors connected through a resistor $R_{L1}$ with the power supply $V_{cc}$, whereas the transistors $Q_{15}$ and $Q_{18}$ have their collectors connected through a resistor $R_{L2}$ with the power supply $V_{cc}$ so that an output signal $V_o$ is obtained from between the collectors of the transistors $Q_{16}$ and $Q_{17}$ and the collectors of the transistors $Q_{15}$ and $Q_{18}$.

According to the variable-gain amplifying circuit thus constructed, it is known that the output signal $V_o$ is expressed by the following equation:

$$V_o = K_x V_y \quad (3)$$

(wherein the letter K designates a full-scale factor which is given by $K = 2R_L/I_1 R_x R_y$).

However, this variable-gain amplifying circuit is composed of a large number of elements, as can be understood from FIG. 9, and has an amplified band width of about 3 MHz so that it cannot be used with high-frequency waves.

SUMMARY OF THE INVENTION

The present invention has been conceived in view of the problems described above and has an object to provide a variable-gain amplifying circuit which can be composed of a reduced number of elements and can vary its gain over a wide band range and in a high accuracy.

This object can be achieved according to the present invention by providing a variable-gain amplifying circuit which comprises: a heating element; a heat-sensitive resistor (i.e., an electronic device having its electric resistance value depending upon the temperature) coupled thermally to said heating element; an amplifier having its gain varied by the resistance value of said heat-sensitive resistor; and means for controlling the quantity of heat generation of said heating element to control the resistance value of said heat-sensitive resistor.

DESCRIPTION OF THE PREFERRED EMBODIMENTS

The present invention will be described in the following in connection with the embodiments thereof with reference to the accompanying drawings.

Figure 1:
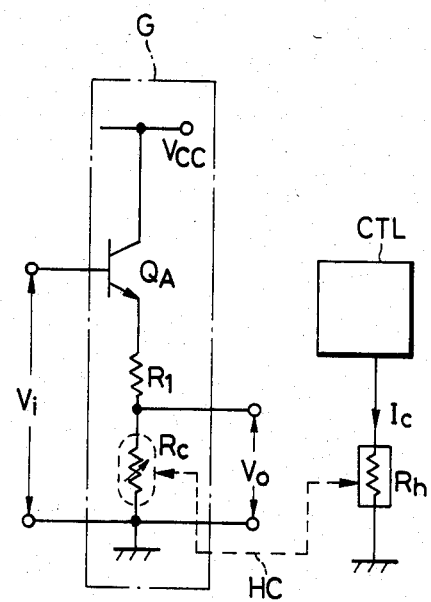
FIG. 1 is a circuit diagram showing an embodiment of the variable-gain amplifying circuit according to the present invention.
Figure 2:
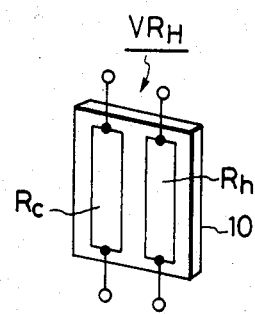
FIG. 2 is a perspective view showing a specific example of a heat-sensitive variable-resistance element to be used in the embodiment.

FIG. 1 is a circuit diagram showing an embodiment of the variable-gain amplifying circuit according to the present invention, and FIG. 2 is a perspective view showing a heat-sensitive variable-resistance element to be used in the same embodiment.

The variable-gain amplifying circuit shown in FIG. 1 is constructed of: a heat-sensitive variable-resistance element $VR_H$ in which a heat-sensitive resistance $R_c$ having its value according to a given temperature and a heating resistor $R_h$ for outputting a heat according to a given electric power are thermally coupled at HC; an amplifier G which is composed of a transistor $Q_A$ having its collector connected with a power supply $V_{cc}$, its emitter connected to the ground through a series circuit of a resistance $R_1$ and the heat-sensitive resistance $R_c$ of the heat-sensitive variable-resistance element $VR_h$, and its base fed with an input signal $V_i$ between itself and the ground so that an output signal $V_o$ is extracted from between the node of the resistances $R_1$ and $R_c$ and the ground; and control means CTL for varying the value of the heat-sensitive resistor $R_c$ by controlling a current $I_c$ to flow through the heating resistor $R_h$ thereby to vary the heat from the heating resistor $R_h$.

That heat-sensitive variable-resistance element $VR_h$ is composed, as shown in FIG. 2, such that the heat-sensitive resistance $R_c$ made of a heat-sensitive resistor of a reactive crystal of $VO_2$ and $CrO_2$, for example, and the heating resistor $R_h$ for generating the heat when supplied with an electric current are mounted on a substrate 10 which is made of a material having a large thermal conductivity such as alumina.

The operations of the variable-gain amplifying circuit having the construction described above will be described in the following.

The input signal $V_i$ flows as a current change through the resistances $R_1$ and $R_c$ when it is applied between the base of the transistor $Q_A$ and the ground. If that current is designated at $i_E$, the output signal $V_o$ is expressed by $V_o = R_c i_E$. If here is assumed $V_i > V_{BE}$, the current $i_E$ is expressed by the following equation:

$$i_E = V_i/(R_1 + R_c) \quad (3)$$

If the above-specified equation is substituted into the equation (3), the following equation holds:

$$V_o = R_c \cdot V_i/(R_1 + R_c) \quad (4)$$

$$= R_c/(R_1 + R_c)V_i.$$

This equation (4) is transformed into:

$$V_o/V_i = R_c/(R_1 + R_c) \quad (5)$$

From this equation, it can be understood that the gain $V_o/V_i$ is so proportional to the resistance ratio $R_c/(R_1 + R_c)$ that the gain $V_o/V_i$ can be varied if the $R_c$ is made variable. As has been described above, therefore, the resistance $R_c$ is used as the heat-sensitive resistance which has its value varied by variably controlling the heat with the control means CTL. Thus, the heat-sensitive variable-resistance element $VR_H$ can be used over a wide band range, partly because the resistance $R_c$ and the heating resistor $R_h$ are electrically insulated from each other and partly because their coupling electrostatic capacitance can be made very low, and can have a wide variation of gain because the resistance-variable range is 10 Ω to several KΩ.

Figure 3:
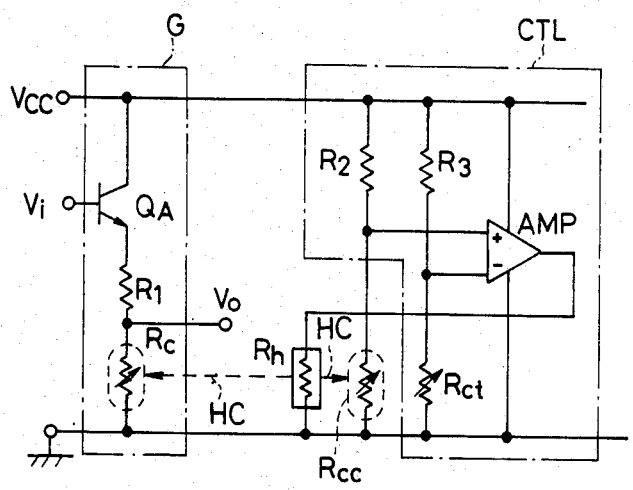
FIG. 3 is a circuit diagram showing another embodiment of the same.
Figure 4:
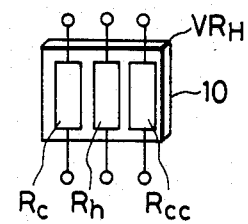
FIG. 4 is a perspective view showing a specific example of the heat-sensitive variable-resistance element to be used in the embodiment of FIG. 3.

FIG. 3 is a circuit diagram showing another embodiment of the present invention, and FIG. 4 is a perspective view showing a specific example of the heat-sensitive variable-resistance element $VR_H$ to be used in the same embodiment.

In FIG. 3, the description will be made by indicating the same elements as those of the foregoing embodiment at the same reference letters.

The embodiment shown in FIG. 3 is different from that shown in FIG. 1 in that the heat-sensitive variable-resistance element $VR_H$ is constructed by thermally coupling a second heat-sensitive resistance $R_{cc}$ having the same characteristics as those of the heat-sensitive resistance $R_c$ to the heating resistor $R_h$, as indicated at HC, and that the control means CTL takes the value of the second heat-sensitive resistance $R_{cc}$ and can control the electric current to be fed to the heating resistor $R_h$ so that the second heat-sensitive resistance $R_{cc}$ may take a predetermined value. More specifically, the control means CTL is constructed such that a series circuit of the second heat-sensitive resistance $R_{cc}$ and a resistance $R_2$ is connected between the power supply $V_{cc}$ and the ground, such that a series circuit of a resistance $R_3$ and a variable resistance $R_{ct}$ is connected between the power supply $V_{cc}$ and the ground, such that both the nodes of the resistances of the aforementioned series circuits are connected with the positive and negative input terminals of a differential amplifier AMP, and such that the output terminal of the differential amplifier AMP is connected through the heating resistance $R_h$ to the ground, whereby the electric power to be supplied to the heating resistance $R_h$ can be so controlled that the second heat-sensitive resistance $R_{cc}$ takes a predetermined value. As a result, no change is made in the circuit construction of the amplifier G.

Here, the heat-sensitive variable-resistance element $VR_H$ is constructed such that there are juxtaposed on the substrate 10 having a high thermal conductivity the heat-resistance $R_c$, the heating resistor $R_h$ and the second heat-sensitive resistance $R_{cc}$ having the same characteristics as those of the heat-sensitive resistance $R_c$.

The operations of the embodiment having the construction described above will be described in the following.

In this embodiment, the operations of the amplifier composed of the transistor $Q_4$, the resistance $R_1$ and the heat-sensitive resistance $R_c$ are the same as those of the embodiment of FIG. 1. Therefore, the power control of the heating resistance $R_h$ will be described in the following.

In order to give a desired resistance value to the heat-sensitive resistor $R_c$, the variable resistance $R_{ct}$ is varied. The potential difference between the value of the resistance $R_{ct}$ and the resistance $R_3$ is fed to the negative input terminal of the differential amplifier AMP. Then, the difference between both the input terminals of the differential amplifier AMP is amplified so that an electric current is fed in accordance with the deviation inbetween to the heating resistor $R_h$. In accordance with the heat from this heating resistor $R_h$, the heat-sensitive resistance $R_c$ is caused to take a value according to that heat. At the same time, the second heat-sensitive resistance $R_{cc}$ takes the same value as that of the heat-sensitive resistance $R_c$.

If here is assumed $R_1 = R_2 = R_3$, the heat-sensitive resistances $R_c$ and $R_{cc}$ are set at the value which is determined by the variable resistance $R_{ct}$.

This will be quantitatively explained in the following. The following equation holds because of $R_1 = R_2 = R_3$, as has been described above, and because the characteristics and temperatures of the resistances $R_c$ and $R_{cc}$ experimentally have a sufficient coincidence:

$$R_{cc}/(R_{cc}+R_2) = R_{ct}/(R_{ct}+R_3) \quad (6)$$

Here, since $R_1 = R_2 = R_3$ and $R_{cc} = R_c$, the above equation (6) is rewritten, as follows:

$$R_c/(R_c + R_1) = R_{cc}/(R_{cc} + R_2)$$
$$= R_{ct}/(R_{ct} + R_3).$$

This equation is transformed into:

$$R_c/(R_c+R_1) = R_{ct}/(R_{ct}+R_3) \quad (7)$$

If the foregoing equation (5) is substituted into the equation (7), the following equation is obtained:

$$V_o/V_i = R_{ct}/(R_{ct}+R_3) \quad (8)$$

From this equation, it can be understood that the gain of the amplifying circuit can be controlled with the variable resistance $R_{ct}$.

According to this embodiment, moreover, it is possible to set the gain which is more accurate and less reluctant to be influenced by the ambient temperature and by the heat of the heat-sensitive resistance $R_c$ itself than the embodiment shown in FIG. 1.

Figure 5:
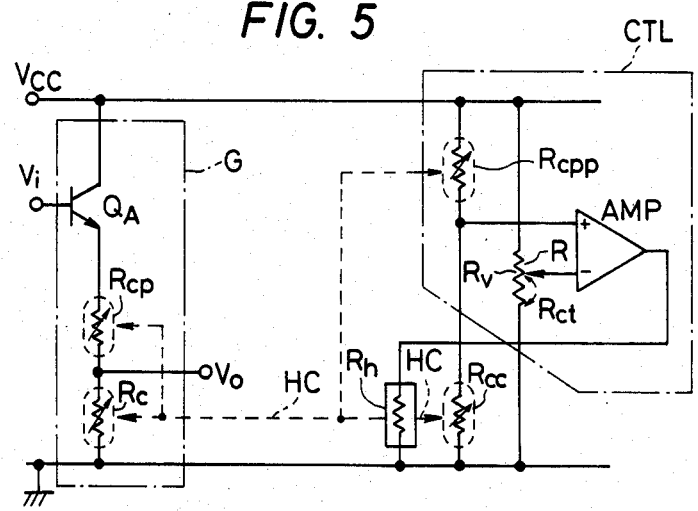
FIG. 5 is a circuit diagram showing still another embodiment of the same.
Figure 6:
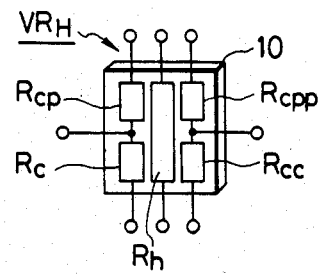
FIG. 6 is a perspective view showing a specific example of the heat-sensitive variable-resistance element to be used in the embodiment of FIG. 5.

FIG. 5 is a circuit diagram showing still another embodiment of the present invention, and FIG. 6 is a perspective view showing the construction of a heat-sensitive variable-resistance element $VR_H$ to be used in the same embodiment.

In FIGS. 5 and 6: reference letters $R_{cp}$ indicate a first heat-sensitive resistance having a positive temperature coefficient; letters $R_c$ a second heat-sensitive resistance having a negative temperature coefficient; letters $R_{cpp}$ a third heat-sensitive resistance having a positive temperature coefficient and the characteristics identical to those of the first heat-sensitive resistance $R_{cp}$; letters $R_{cc}$ a fourth heat-sensitive resistance having a negative temperature coefficient and the characteristics identical to those of the second heat-sensitive resistance $R_c$; letter R the total value of a variable resistance $R_v$; and letters $R_{ct}$ a value proportional to the angle of rotation of the variable resistance $R_v$. The above resistances $R_{cp}$, $R_c$, $R_{cpp}$ and $R_{cc}$ and the aforementioned heating resistor $R_h$ are so mounted on the substrate 10 of high thermal conductivity, as shown in FIG. 6, such that the temperature differences can be neglected, thus constructing the heat-sensitive temperature variable-resistance element $VR_H$.

The embodiment shown in FIG. 5 is different from that shown in FIG. 3 in the construction of the heat-sensitive variable-resistance element $VR_H$ and in that the element $VR_H$ is applied to the amplifier G and the control means CTL.

More specifically, the series circuit of the first heat-sensitive resistance $R_{cp}$ and the second heat-sensitive resistance $R_c$ is connected between the emitter of the transistor $Q_A$ of the amplifier G and the ground, and the transistor $Q_A$ has its collector connected to the power supply $V_{cc}$ to extract the output signal $V_o$ from the node of the resistances $R_{cp}$ and $R_c$ and its base fed with the input signal $V_i$ between itself and the ground. On the other hand, the control means CTL is constructed in the following manner. The variable resistance $R_v$ has its fixed terminals connected between the power supply $V_{cc}$ and the ground; the series circuit of the third heat-sensitive resistance $R_{cpp}$ and the fourth heat-sensitive resistance $R_{cc}$ is connected between the power supply $V_{cc}$ and the ground; the variable resistance $R_v$ has its variable terminal connected with the negative input terminal of the differential amplifier AMP; and the node of the two resistances $R_{cpp}$ and $R_{cc}$ is connected with the positive input terminal of the same differential amplifier AMP; and the output terminal of the same differential amplifier AMP is connected to the ground through the heating resistor $R_h$. Incidentally, the resistances $R_{cp}$, $R_{cpp}$, $R_c$ and $R_{cc}$ and the heating resistor $R_h$ are thermally coupled at HC.

The operations of the embodiment thus constructed are generally identical to those of the embodiment of FIG. 3. Then, the operations of this embodiment will be described by the use of numerical equations.

The following equations hold for the construction shown in FIG. 5:

$$R_c/(R_{cp} + R_c) = R_{cc}/(R_{cpp} + R_{cc}) \quad (9)$$
$$= R_{ct}/R.$$

These equations are transformed into:

$$R_c/(R_{cp}+R_c) = R_{ct}/R \quad (10)$$

If this equation (10) is substituted into the foregoing equation (8), the following equation is obtained:

$$V_o/V_i = R_{ct}/R \quad (11)$$

This means that the gain can be set according to the value $R_{ct}$ of the variable resistance $R_v$, i.e., the angle of rotation of the variable resistance $R_v$.

The embodiment shown in FIG. 5 can have a wider variable range of the gain than the embodiment shown in FIG. 3.

Figure 7:
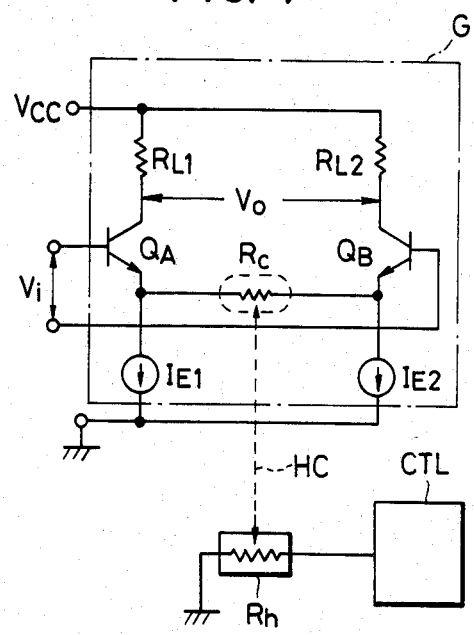
FIG. 7 is a circuit diagram showing a further embodiment of the present invention.
Figure 8:
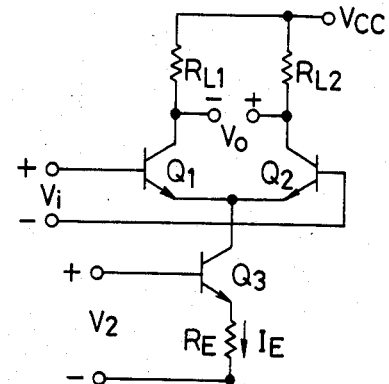
FIGS. 8 and 9 are circuit diagrams showing the variable-gain amplifying circuits which have been proposed in the prior art.
Figure 9:
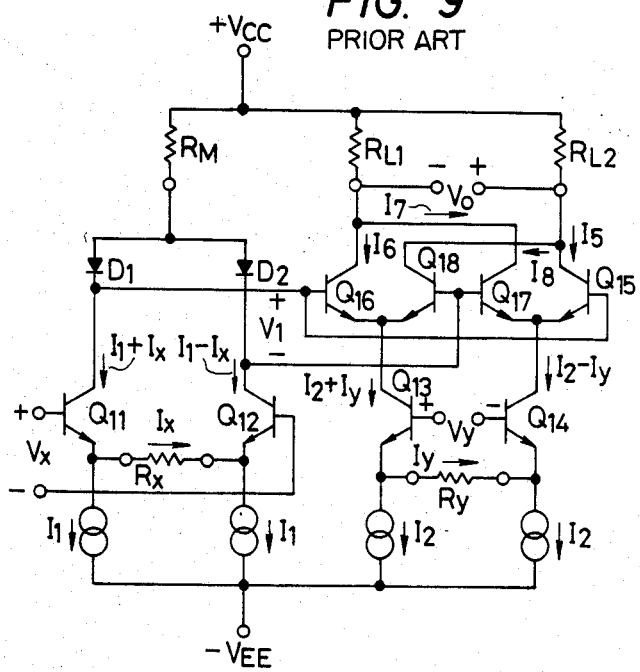

FIG. 7 is a circuit diagram showing a further embodiment of the present invention. As shown in FIG. 7, the amplifier G is constructed in the following manner. Here, reference letters $Q_A$ and $Q_B$ indicate transistors; letters $R_c$ a heat-sensitive resistance; letters $I_{E1}$ and $I_{E2}$ bias current sources; and letters $R_{L1}$ and $R_{L2}$ resistances.

The transistor $Q_A$ has its collector connected through the resistance $R_{L1}$ with the power supply $V_{cc}$ and its emitter connected through the bias current source $I_{E1}$ to the ground, whereas the transistor $Q_B$ connected through the resistance $R_{L2}$ with the power supply $V_{cc}$ and its emitter connected through the bias current source $I_{E2}$ to the ground, and the two transistors $Q_A$ and $Q_B$ have their emitters connected with each other through the heat-sensitive resistance $R_c$ and have their bases fed with the input signal $V_i$ so that the output signal $V_o$ is extracted from the collectors of those transistors. The temperature to be applied to the heat-sensitive resistance $R_c$ may be controlled by controlling the heating resistor $R_h$ with the control means CTL having the construction of the embodiment shown in FIGS. 3 and 4.

The operations of the embodiment thus constructed will be described in the following.

The following equation holds with the aforementioned construction and for $R_{L1}=R_{L2}=R_L$ and $I_{E1}=I_{E2}$:

$$V_0=2R_L/R_c \cdot V_i \qquad (12)$$

This equation is transformed into:

$$V_o/V_i=2R_L/R_c \qquad (13)$$

so that the gain can be controlled by controlling the value of the resistance $R_c$.

As compared with the embodiment shown in FIG. 1, the embodiment shown in FIG. 7 can set the bias currents of the transistors $Q_A$ and $Q_B$ at the optimum values irrespective of the input signal by the current sources $I_{E1}$ and $I_{E2}$ because it can differentially receive the input signal.

As has been described hereinbefore, according to the present invention, there can be attained an effect that it is possible to provide a variable-gain amplifying circuit having a wide band range.

What is claimed is:

1. A variable-gain amplifying circuit comprising:
a heating resistor;
first and second heat-sensitive resistances coupled thermally to said heating resistor;
an amplifier including: a transistor having an emitter, a collector and a base, said emitter being connected through a resistance with said first heat-sensitive resistance and said collector connected with a power supply; an input terminal for feeding an input signal to the base of said transistor; and an output terminal for extracting an output signal from a connecting point of said resistance and said first heat-sensitive resistance; and
an amplifier having an input terminal and an output terminal, said input terminal being fed with a voltage drop which is established in said second heat-sensitive resistance, wherein an output signal which is delivered out of said output terminal is supplied as a heating current to said heating resistor.

2. A variable-gain amplifying circuit according to claim 1, wherein said heating resistor and said first and second heat-sensitive resistances are arranged on a common substrate made of a substance having a high thermal conductivity.

3. A variable-gain amplifying circuit comprising:
a heating resistor;
first and second heat-sensitive resistances respectively coupled thermally to said heating resistor and having positive and negative temperature coefficients, respectively;
third and fourth heat-sensitive resistances respectively coupled thermally to said heating resistor and having the same characteristics as those of said first and second heat-sensitive resistances, respectively;
an amplifier including: a transistor having an emitter, a collector and a base, said emitter being connected with the series circuit of said first and second heat-sensitive resistances and said collector being connected with a power supply; an input terminal for feeding an input signal to said base of said transistor; and an output terminal for extracting an output signal from a connecting point of said first and second heat-sensitive resistances; and
a differential amplifier having two input terminals and an output terminal, one of said input terminals being connected with a connecting point of said third and fourth heat-sensitive resistances, which are connected in series between said power supply and a reference potential, and the other of said input terminals connected with a moving terminal of a variable resistance, which is connected between said power supply and said reference potential, and wherein said output terminal is connected with said heating resistor for feeding its output signal as a heating current.

4. A variable-gain amplifying circuit according to claim 3, wherein said heating resistor and said first, second, third and fourth heat-sensitive resistances are arranged on a common substrate made of a substance having a high thermal conductivity.

* * * * *